(12) United States Patent
Demenschonok et al.

(10) Patent No.: US 10,152,146 B2
(45) Date of Patent: Dec. 11, 2018

(54) COSMETICALLY HIDDEN ELECTROSTATIC DISCHARGE PROTECTION STRUCTURES

(71) Applicant: Microsoft Technology Licensing, LLC, Redmond, WA (US)

(72) Inventors: Filipp Demenschonok, Seattle, WA (US); Sheila A. Longo, Seattle, WA (US); David Ian Rosen, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 90 days.

(21) Appl. No.: 14/856,161

(22) Filed: Sep. 16, 2015

(65) Prior Publication Data

US 2017/0077696 A1    Mar. 16, 2017

(51) Int. Cl.
| | |
|---|---|
| G06F 3/0354 | (2013.01) |
| G06F 3/02 | (2006.01) |
| H01L 23/60 | (2006.01) |
| H01L 27/02 | (2006.01) |
| G06K 9/00 | (2006.01) |

(52) U.S. Cl.
CPC ............ *G06F 3/03547* (2013.01); *G06F 3/02* (2013.01); *G06K 9/00053* (2013.01); *H01L 23/60* (2013.01); *H01L 27/0248* (2013.01)

(58) Field of Classification Search
USPC ................................................. 361/212, 220
See application file for complete search history.

(56) References Cited

U.S. PATENT DOCUMENTS

| | | |
|---|---|---|
| 4,750,081 A | 6/1988 | Zhang |
| 5,981,311 A | 11/1999 | Chia et al. |
| 6,110,815 A | 8/2000 | Chia et al. |
| 6,513,386 B2 | 2/2003 | Barclay et al. |
| 7,285,846 B1 | 10/2007 | Tran |
| 7,463,466 B2 | 12/2008 | Hsueh et al. |
| 8,081,409 B2 | 12/2011 | Wu |
| 8,373,202 B2 | 2/2013 | Lin et al. |

(Continued)

FOREIGN PATENT DOCUMENTS

EP    0789334 A2    8/1997

OTHER PUBLICATIONS

"International Search Report and Written Opinion Issued in PCT Application No. PCT/US2016/045671", dated Nov. 11, 2016, 11 Pages.

(Continued)

*Primary Examiner* — Danny Nguyen
(74) *Attorney, Agent, or Firm* — Ray Quinney & Nebeker; Paul N. Taylor; Miia Kati Janette Sula

(57) ABSTRACT

Cosmetically hidden electrostatic discharge (ESD) protection structures and systems are disclosed herein. In one example, an electronic device is provided. The electronic device includes an integrated circuit and an ESD protection structure positioned at least partially around a perimeter of the integrated circuit, where the ESD protection structure is configured to protect the integrated circuit from an electrostatic discharge strike. The electronic device further includes a concealing layer positioned on a surface of the ESD protection structure, the concealing layer configured to at least partially conceal the ESD protection structure from view.

20 Claims, 5 Drawing Sheets

(56) References Cited

U.S. PATENT DOCUMENTS

| | | |
|---|---|---|
| 8,616,451 B1 | 12/2013 | Rao |
| 8,717,775 B1 | 5/2014 | Bolognia et al. |
| 9,001,081 B2 | 4/2015 | Pope et al. |
| 2003/0021495 A1 | 1/2003 | Cheng |
| 2005/0237439 A1* | 10/2005 | Mai .................. G06F 3/045 349/12 |
| 2007/0001249 A1 | 1/2007 | Chou et al. |
| 2011/0032648 A1 | 2/2011 | Darthenay et al. |
| 2012/0049309 A1 | 3/2012 | Kiyomoto et al. |
| 2014/0071384 A1* | 3/2014 | Ho .................. G02F 1/136204 349/106 |
| 2014/0362306 A1* | 12/2014 | Chen .................. G06F 1/1656 349/12 |
| 2015/0243571 A1 | 8/2015 | Tsai et al. |

OTHER PUBLICATIONS

"Synaptics Reveals Touch Fingerprint Sensor Amid Samsung Speculation", Planet Biometrics, Mar. 2, 2015, 2 pages, http://www.planetbiometrics.com/article-details/i/2760/desc/synaptics-reveals-touch-fingerprint-sensor-amid-samsung-speculation/.

"Second Written Opinion Issued in PCT Application No. PCT/US2016/045671", dated Jul. 31, 2017, 6 Pages.

\* cited by examiner

COSMETICALLY HIDDEN ELECTROSTATIC DISCHARGE PROTECTION STRUCTURES

TECHNICAL FIELD

The disclosure relates to electronic devices and systems having cosmetically hidden electrostatic discharge protection structures.

BACKGROUND

Electrostatic discharge (ESD) refers to the flow of electricity between two electrically charged objects caused by contact, an electrical short, or dielectric breakdown. An ESD may occur when differently charged objects are brought close together or when the dielectric between them breaks down, potentially creating a spark. The ESD may cause failure of an electronics component such as an integrated circuit. Therefore, electronics manufacturers may install an ESD protection structure or device near the electronics component to divert the electrostatic discharge of an approaching body to the ground.

In certain electronic devices, a metallic frame or bezel may be positioned around the sensor to protect the sensor against an ESD strike. It may be undesirable for the ESD protection structure to be visible to the user.

SUMMARY

Electronic devices and systems having cosmetically hidden electrostatic discharge protection structures are disclosed herein. In one embodiment, an electronic device includes an integrated circuit; an electrostatic discharge (ESD) protection structure positioned at least partially around a perimeter of the integrated circuit, the ESD protection structure configured to protect the integrated circuit from an electrostatic discharge strike; and a concealing layer positioned on a surface of the ESD protection structure, the concealing layer configured to at least partially conceal the ESD protection structure from view.

In another embodiment, an electronic device includes a substrate; an integrated circuit positioned on a surface of the substrate, defining a plane at the surface of the substrate; an electrostatic discharge (ESD) protection structure positioned at least partially around a perimeter of the integrated circuit, wherein the ESD protection structure is configured to protect the integrated circuit from an electrostatic discharge strike, and wherein the ESD protection structure extends from the substrate in a direction perpendicular to the plane of the surface of the substrate; and a concealing layer positioned on a surface of the ESD protection structure, wherein the concealing layer is configured to at least partially conceal the ESD protection structure from view, and wherein the concealing layer is positioned between the ESD protection structure and the integrated circuit.

In another embodiment, an input device includes a fingerprint sensor integrated circuit; an electrostatic discharge (ESD) protection structure positioned at least partially around a perimeter of the fingerprint sensor integrated circuit; the ESD protection structure configured to protect the fingerprint sensor integrated circuit from an electrostatic discharge strike; and a concealing layer positioned on a surface of the ESD protection structure, the concealing layer configured to at least partially conceal the ESD protection structure from view.

DESCRIPTION OF THE DRAWING FIGURES

For a more complete understanding of the disclosure, reference is made to the following detailed description and accompanying drawing figures, in which like reference numerals may be used to identify like elements in the figures.

Figure 1:
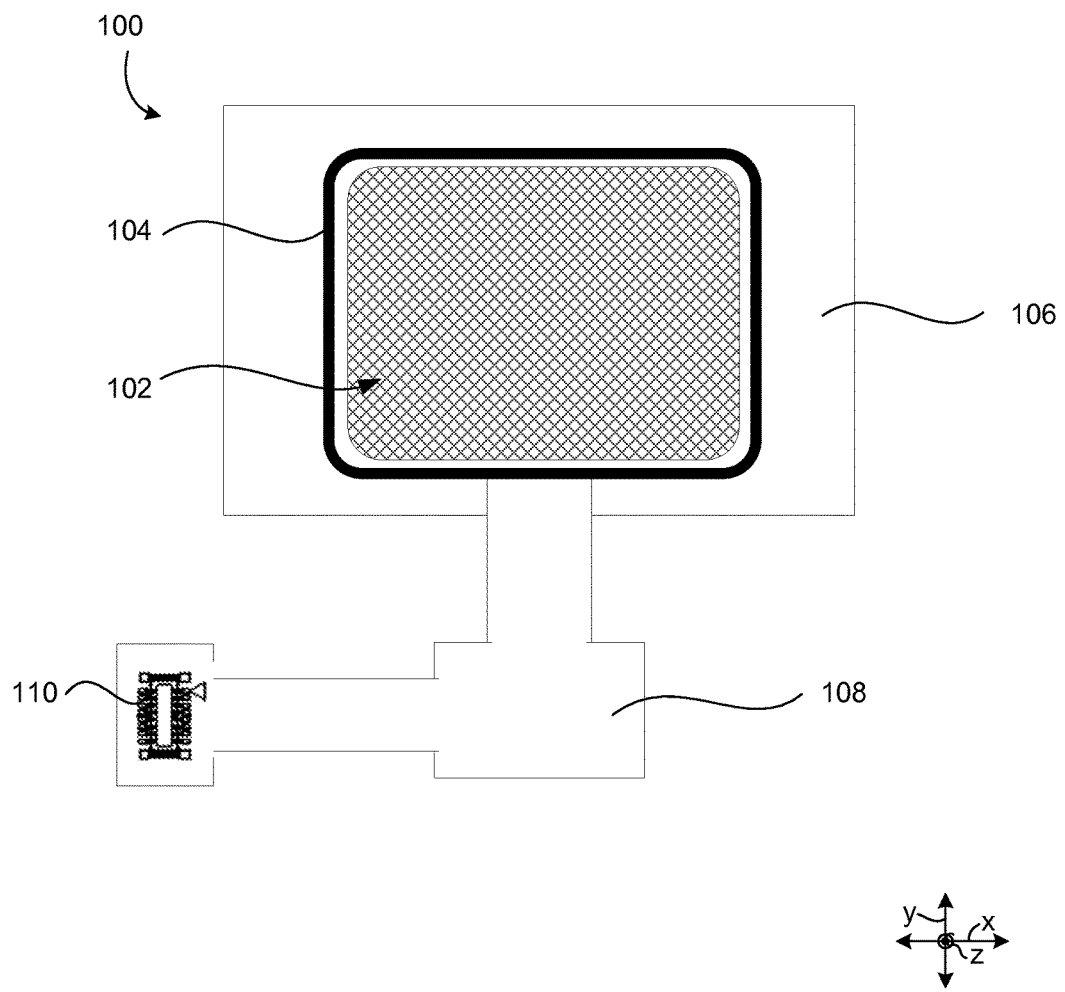
FIG. 1 depicts an example of an integrated circuit having electrostatic discharge protection.

While the disclosed systems and methods are susceptible of embodiments in various forms, specific embodiments are illustrated in the drawing (and are hereafter described), with the understanding that the disclosure is intended to be illustrative, and is not intended to limit the claim scope to the specific embodiments described and illustrated herein.

DETAILED DESCRIPTION

As disclosed herein, examples are provided for concealing the ESD protection structure while maintaining the desired path of an electrostatic discharge through the protection structure, therein protecting the electronics component (e.g., an integrated circuit) and eliminating the need for a metallic frame or bezel.

Such concealed or cosmetically hidden ESD structures may be incorporated into any number of electronic devices or input devices of an electronic device. For example, the ESD protection structure may be incorporated into personal computers, server computers, tablet or other handheld computing devices, laptop or mobile computers, communications devices such as mobile phones, multiprocessor systems, microprocessor-based systems, set top boxes, programmable consumer electronics, network PCs, minicomputers, mainframe computers, or audio or video media players. In certain examples, the cosmetically hidden ESD structure may be incorporated within a wearable electronic device, wherein the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

Non-limiting examples of cosmetically hidden ESD protection structures are described in greater detail below.

Exemplary Configurations of ESD Structure

In certain examples, an ESD protection structure is configured to protect an integrated circuit within an electronic device from undesired electrostatic discharges. In some examples, the integrated circuit is a sensor integrated circuit. In particular, the sensor integrated circuit may be a fingerprint sensor integrated circuit.

FIG. 1 depicts a non-limiting example of an electronic device 100 having an ESD protection structure. In this example, the electronic device 100 includes a fingerprint sensor integrated circuit 102 and an ESD protection structure 104 surrounding the perimeter of the sensor IC 102. The sensor IC 102 and ESD protection structure 104 are positioned on a substrate 106. An extension 108 is positioned on the surface of the substrate connecting the ESD protection structure 104 to ground with a pin/plug connector 110.

In this example, when a user of the electronic device 100 contacts or approaches the surface of the fingerprint sensor IC 102 with their finger, the ESD protection structure 104 is configured to control the route of an ESD strike, therein protecting the sensor IC 102 from an electrostatic discharge from the user's finger. This is important because the ESD protection structure 104 prevents an electrostatic discharge from flowing through the sensor IC 102 and potentially damaging or shorting the sensor IC 102, and render it inoperable. The ESD protection structure 104 also eliminates the need for a metallic frame or bezel to surround the sensor IC 102.

The ESD protection structure 104 may be made of a conductive material. For example, the conductive material may include one or more metals such as gold, silver, copper, aluminum, zinc, or nickel. In some examples, the ESD protection structure 104 is a metal plated trace. In one particular example, the ESD protection structure 104 is a gold plated trace.

In certain examples, the protection structure includes at least one segment positioned around at least a portion of the sensor IC. For example, as depicted in FIG. 1, the ESD protection structure 104 is a single, continuous trace surrounding the entire perimeter of the sensor IC 102. In an alternative example, the protection structure includes one segment positioned around less than the entire perimeter of the sensor IC. In another example, the protection structure includes multiple segments positioned around less than the entire perimeter of the sensor IC.

The material and the positioning of ESD protection structure around at least a portion of the sensor IC is configured to provide protection for the electrostatic discharge strike to travel through the protection structure, regardless of where the user's finger touches or approaches the sensor IC 102 (e.g., upper-left corner, upper edge, upper-right corner, right edge, lower-right corner, lower edge, lower-left corner, left edge, or center of the sensor IC). In other words, the material and location of the ESD protection structure is configured to provide a dielectric breakdown path for an electronic discharge strike which is less than the dielectric breakdown path of an electronic discharge strike traveling through the sensor IC (e.g., from the surface to the opposite side or base connected to the substrate).

Figure 2:
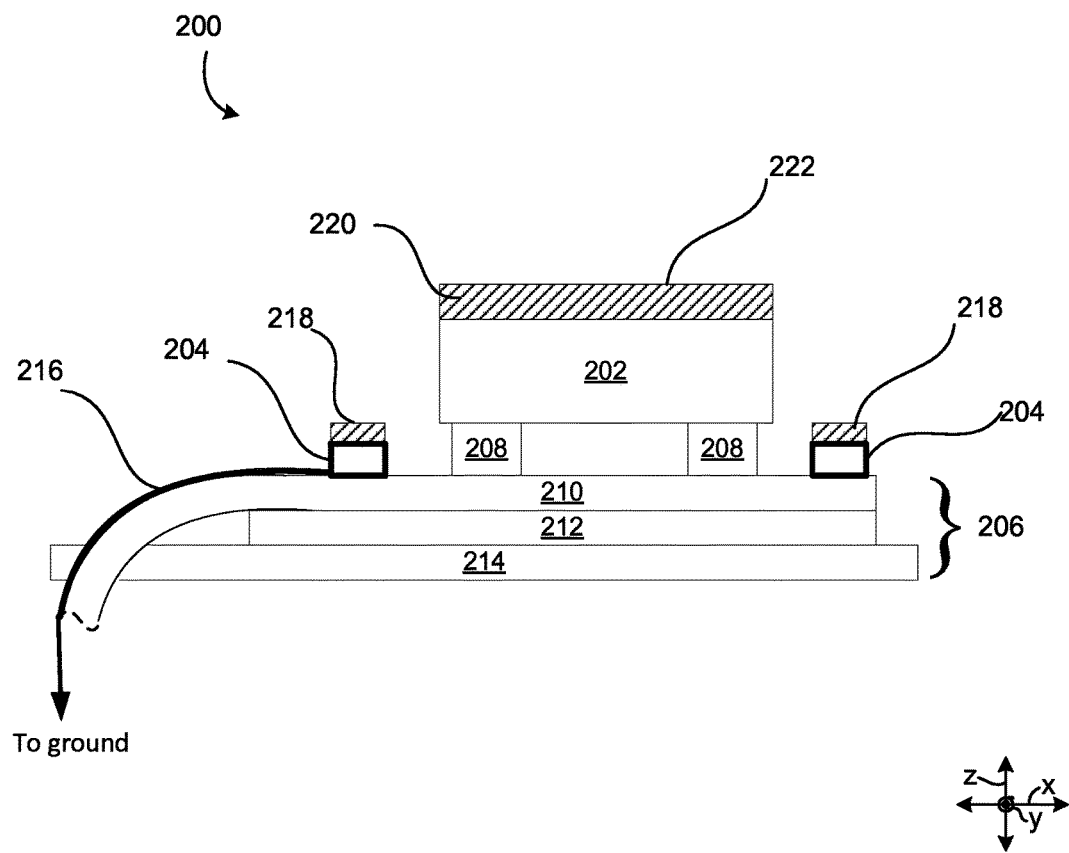
FIG. 2 depicts an example cross-section of an integrated circuit having an electrostatic discharge protection structure.

FIG. 2 depicts an example cross-section of an electronic device 200 having a sensor integrated circuit 202 and an electrostatic discharge (ESD) protection structure 204 surrounding at least a portion of the sensor IC 202. The sensor IC 202 is affixed to a substrate 206 via a connecting layer 208 (e.g., solder).

In this non-limiting example, the substrate 206 includes multiple layers, e.g., a flexible print circuit layer 210, a riser layer 212, and a stiffener or backing layer 214. The riser layer 212 may be a printed circuit board or glass-reinforced epoxy laminate sheet such as FR-4. The height of the riser layer (in the z-direction) may be configured such that the surface 222 of the sensor IC 202 is at a same height as another component of the electronic device 200 (e.g., an input component such as a trackpad or QWERTY keyboard). The stiffener layer 214 may be a metal layer configured to provide a rigid backing or support to the electronic device at the sensor IC. The metal layer may include stainless steel or aluminum, for example.

As depicted in FIG. 2, the ESD protection structure 204 is positioned on the substrate 206 as well, specifically the flexible print circuit layer 210 of the substrate 206. As such, the ESD protection structure 204 and sensor IC 202 are co-planar (or positioned on a same plane). The ESD protection structure 204 is connected to a ground via an extension 216 of the ESD protection structure. The extension 216 may also be connected or affixed to the surface of the substrate 206 (e.g., flexible print circuit 210). The extension 216 may be made of the same or a different conductive material as the ESD protection structure 204. This configuration allows for controlling the route of current that flows in an ESD strike because the strike is dissipated to ground in a safe route without damaging the sensor IC 202.

A concealing layer 218 is positioned over the surface of the ESD protection structure 204. The concealing layer 218 is configured to at least partially conceal or hide the ESD protection structure 204 from the view of the user of the electronic device 200. Additionally, the concealing layer 218 may provide a uniform color or pattern in the area of the electronic device 200 at or surrounding the sensor IC 202. In other words, any undesired pattern or color of the ESD protection structure 204 (e.g., the color of a metal trace) may be concealed with the concealing layer 218 to appear uniform in color with the surrounding electronic components.

The concealing layer 218 may be made of a conductive material. In one example, the concealing layer 218 is a paint layer or a carbon screen. The paint layer or carbon screen may be conductive. For example, the paint layer may be a latex or acrylic paint having a conductive composition (e.g., a carbon composition such as graphite powder). The paint layer or carbon screen may be configured to match the color or be similar in color to the sensor IC surface color and/or the color of an adjacent layer of the electronic device 200.

The concealing layer 218 may have a thickness or height in the z-direction such that the dielectric breakdown path for the ESD protection structure 204 and concealing layer 218 remains less than the dielectric breakdown path for the sensor IC 202. In other words, the height of the concealing layer 218 (combined with the type of material of the concealing layer 218) should not be configured such that a potential electrostatic discharge strike would travel through the sensor IC 202 instead of through the ESD protection structure 204. In some examples, the thickness or height in the z-direction of the concealing layer 218 is 1-100 micrometers (µm), 1-50 µm, 1-25 µm, or 1-10 µm.

In certain examples, a surface layer 220 is positioned on top of the sensor IC 202 (such that the surface layer 220 is exposed to the user of the electronic device 200). The surface layer 220 may be configured to match the color or be similar in color to the color of the concealing layer 218 and/or an adjacent layer of the electronic device 200. The surface layer 220 may be made of an insulator or non-conductive material. In other examples, the surface layer 220 is a conductive layer having a conductivity less than a conductivity of the concealing layer. For example, the surface layer 220 may include some level of conductive material to provide a matching or similar color to the concealing layer 218. The surface layer 220 may be a paint layer having some amount of conductive carbon within the composition. The amount of conductive material within the surface layer composition may be less than 10% by weight carbon, less than 5% by weight carbon, or less than 1% by weight carbon.

The surface layer 220 may be configured such that the dielectric breakdown path remains larger for an ESD strike traveling through the sensor IC 202 and surface layer 220 in comparison with the dielectric breakdown path of an ESD strike traveling through the ESD protection structure 204 and concealing layer 218.

As previously noted, the surface layer 220 may be a paint layer. In alternative examples, the surface layer 220 may be a glass layer. The surface layer 220 may have a thickness or height in the z-direction such that the sensor IC 202 is not adversely affected (e.g., such that fingerprint analysis remains functional). In some examples, the thickness or height in the z-direction of the concealing layer 220 is 1-100 micrometers (μm), 1-50 μm, 1-25 μm, or 1-10 μm.

As noted, the color of the concealing layer 218 and the color of the surface layer 220 may be coordinated with each other. In one example, the two layers are made of black paint. Other colors are also possible, and may be chosen based on the color of the surrounding components of the electronic device (e.g., red, green, blue, magenta, yellow, cyan).

Figure 3:
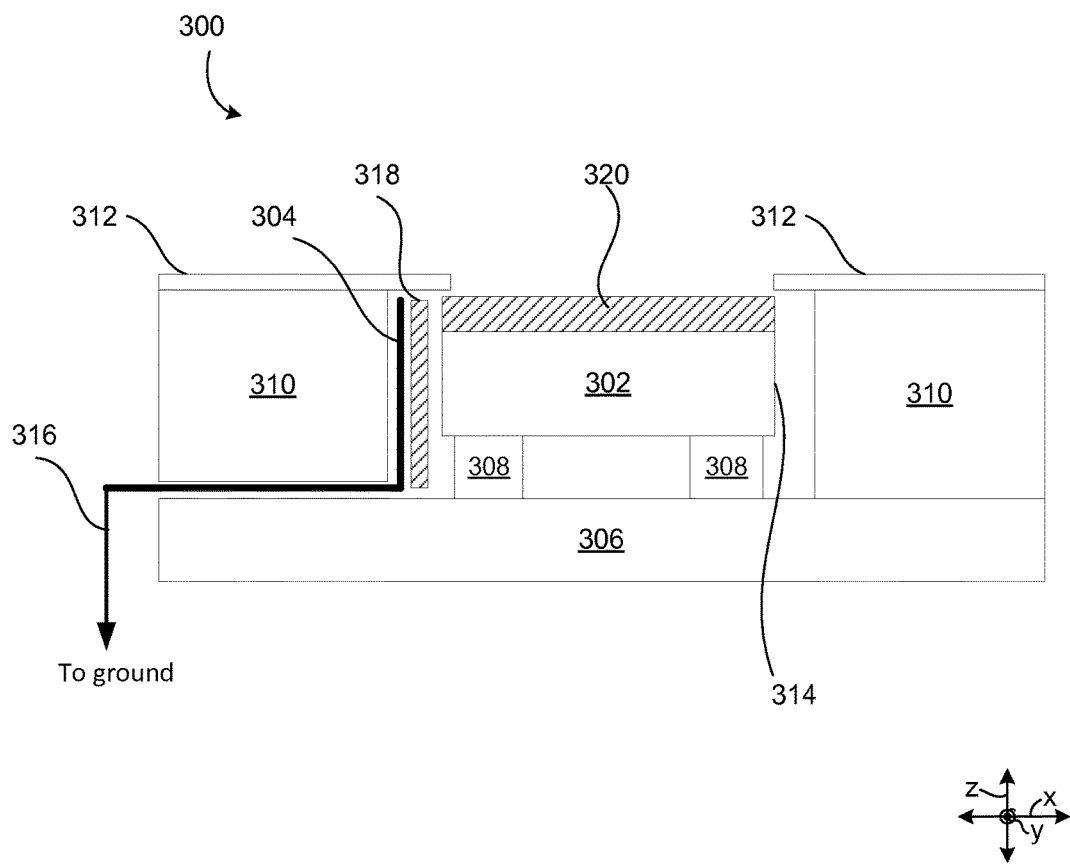
FIG. 3 depicts an additional example of a cross-section of an integrated circuit with an electrostatic discharge protection structure.

FIG. 3 depicts an alternative example cross-section of an electronic device 300 having a sensor integrated circuit 302 and an electrostatic discharge (ESD) protection structure 304 surrounding a portion of the sensor IC 302. As depicted in this example, the ESD protection structure 304 does not surround the entire perimeter of the sensor IC 302. The sensor IC 302 is affixed to a substrate 306 via a connecting layer 308 (e.g., solder). As such, the sensor IC 302 and substrate 306 both lie along the x-y plane. The substrate 306 may include multiple layers, e.g., a flexible print circuit layer, a riser layer, and/or a stiffener or backing layer.

One or more layers may be positioned around the sensor IC 302 of the electronic device 300. As depicted in FIG. 3, a plastic layer 310 is positioned above the substrate 306. Additionally, a cover layer 312 is positioned on top of the plastic layer 310. The cover layer 312 may be made of a fabric. The cover layer 312 may extend over the outer edge 314 of the sensor IC 302 (as viewed along the z-axis). Such a configuration may be advantageous to prevent or limit a user from viewing the ESD protection structure 304 positioned beneath the cover layer 312.

As depicted in FIG. 3, the ESD protection structure 304 extends from substrate 306 toward the cover layer 312 in the z-direction (e.g., perpendicular to the x-y plane of the sensor IC 302 and substrate 306). The ESD protection structure 304 may be positioned on or next to the surface of the internal plastic layer 310. As such, the ESD protection structure 304 and sensor IC 302 are not co-planar. The ESD protection structure 304 is connected to a ground via an extension 316 of the ESD protection structure 304. The extension 316 may also be connected or affixed to the surface of the substrate. The extension 316 may be made of the same or a different conductive material as the ESD protection structure 304.

A concealing layer 318 is positioned over a surface of the ESD protection structure 304. The concealing layer 318 is configured to visibly conceal or hide the ESD protection structure 318 from the view of the user of the electronic device 300. This is advantageous because the area of the electronic device 300 at or surrounding the sensor IC 302 may appear uniform in color or pattern. In other words, any undesired appearance, pattern, or color of the ESD protection structure 304 (e.g., the color of a metal trace) may be concealed with the concealing layer 318 to appear uniform in color with the surrounding electronic components.

The concealing layer 318 may also extend in the z-direction perpendicular to the x-y plane of the sensor IC 302 and substrate 306. In certain examples, the concealing layer 318 may be positioned between the ESD protection structure 304 and the sensor IC 302.

The concealing layer 318 may be made of a conductive material. In one example, the concealing layer 318 is a paint layer. The paint layer may be conductive. The paint layer may be configured to match the color or be similar in color to the sensor IC surface color and/or the color of an adjacent layer of the electronic device 300.

The concealing layer 318 may have a thickness or width in the x-direction such that the dielectric breakdown path for the ESD protection structure 304 and concealing layer 318 remains less than the dielectric breakdown path for the sensor IC 302. In other words, the width of the concealing layer 318 (combined with the type of material of the concealing layer 138) should not be configured such that current of an electrostatic discharge strike would travel through the sensor IC 302 instead of through the ESD protection structure 304. In some examples, the thickness or width in the x-direction of the concealing layer 318 is 1-100 micrometers (μm), 1-50 μm, 1-25 μm, or 1-10 μm.

In certain examples, a surface layer 320 is positioned on the surface of the sensor IC 302. The surface layer 320 may be configured to match the color or be similar in color to the color of the concealing layer 318 and/or the cover layer 312 of the electronic device 300. The surface layer 320 may be made of a non-conductive material (or a minimally conductive material such that the dielectric breakdown path remains larger for a ESD strike traveling through the sensor IC 302 and surface layer in comparison with the dielectric breakdown path of an ESD strike traveling through the ESD protection structure 304 and concealing layer 318). For example, the surface layer 220 may be a paint layer having some amount of conductive carbon within the composition.

The surface layer 320 may be a paint layer. In alternative examples, the surface layer 320 may be a glass layer. The surface layer 320 may have a thickness or height in the z-direction such that the sensor IC 302 is not adversely affected (e.g., such that fingerprint analysis remains functional). In some examples, the thickness or height in the z-direction of the concealing layer 320 is 1-100 micrometers (μm), 1-50 μm, 1-25 μm, or 1-10 μm.

As noted, the color of the concealing layer 318 and the color of the surface layer 320 may be coordinated with each other (and, in some examples, the surrounding cover layer 312). In one example, the two layers are made of black paint. Other colors are also possible, and may be chosen based on the color of the surrounding components of the electronic device (e.g., the surrounding cover layer 312).

Exemplary Computing Environment

Figure 4:
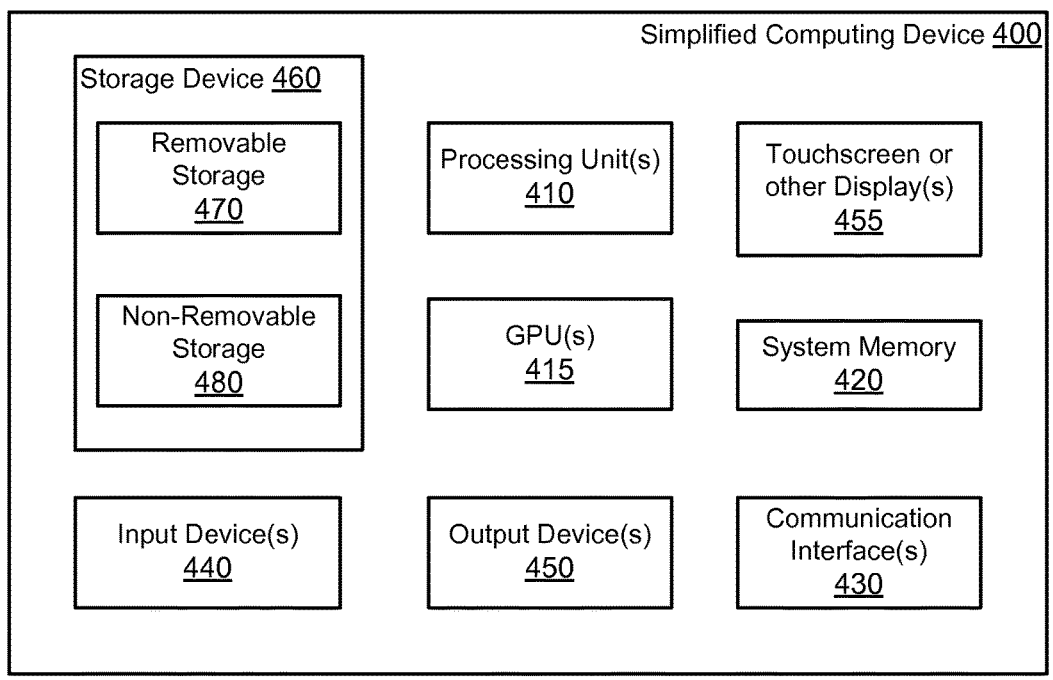
FIG. 4 is a block diagram of a computing environment in accordance with one example for implementation of the disclosed sensor, input device, or aspects thereof.

With reference to FIG. 4, a cosmetically hidden ESD structure as described above may be incorporated within an exemplary computing environment 400. The computing environment 400 may correspond with one of a wide variety of computing devices, including, but not limited to, personal computers (PCs), server computers, tablet and other handheld computing devices, laptop or mobile computers, communications devices such as mobile phones, multiprocessor systems, microprocessor-based systems, set top boxes, programmable consumer electronics, network PCs, minicomputers, mainframe computers, or audio or video media players. In certain examples, the computing device may be a wearable electronic device, wherein the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

The computing environment 400 has sufficient computational capability and system memory to enable basic computational operations. In this example, the computing environment 400 includes one or more processing unit(s) 410, which may be individually or collectively referred to herein as a processor. The computing environment 400 may also include one or more graphics processing units (GPUs) 415. The processor 410 and/or the GPU 415 may include integrated memory and/or be in communication with system memory 420. The processor 410 and/or the GPU 415 may be a specialized microprocessor, such as a digital signal processor (DSP), a very long instruction word (VLIW) processor, or other microcontroller, or may be a general-purpose central processing unit (CPU) having one or more processing cores. The processor 410, the GPU 415, the system memory 420, and/or any other components of the computing environment 400 may be packaged or otherwise integrated as a system on a chip (SoC), application-specific integrated circuit (ASIC), or other integrated circuit or system.

The computing environment 400 may also include other components, such as, for example, a communications interface 430. One or more computer input devices 440 (e.g., pointing devices, keyboards, audio input devices, video input devices, haptic input devices, or devices for receiving wired or wireless data transmissions) may be provided. The input devices 440 may include one or more touch-sensitive surfaces, such as track pads. Various output devices 450, including touchscreen or touch-sensitive display(s) 455, may also be provided. The output devices 450 may include a variety of different audio output devices, video output devices, and/or devices for transmitting wired or wireless data transmissions.

The computing environment 400 may also include a variety of computer readable media for storage of information such as computer-readable or computer-executable instructions, data structures, program modules, or other data. Computer readable media may be any available media accessible via storage devices 460 and includes both volatile and nonvolatile media, whether in removable storage 470 and/or non-removable storage 480. Computer readable media may include computer storage media and communication media. Computer storage media may include volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may accessed by the processing units of the computing environment 400.

Figure 5:
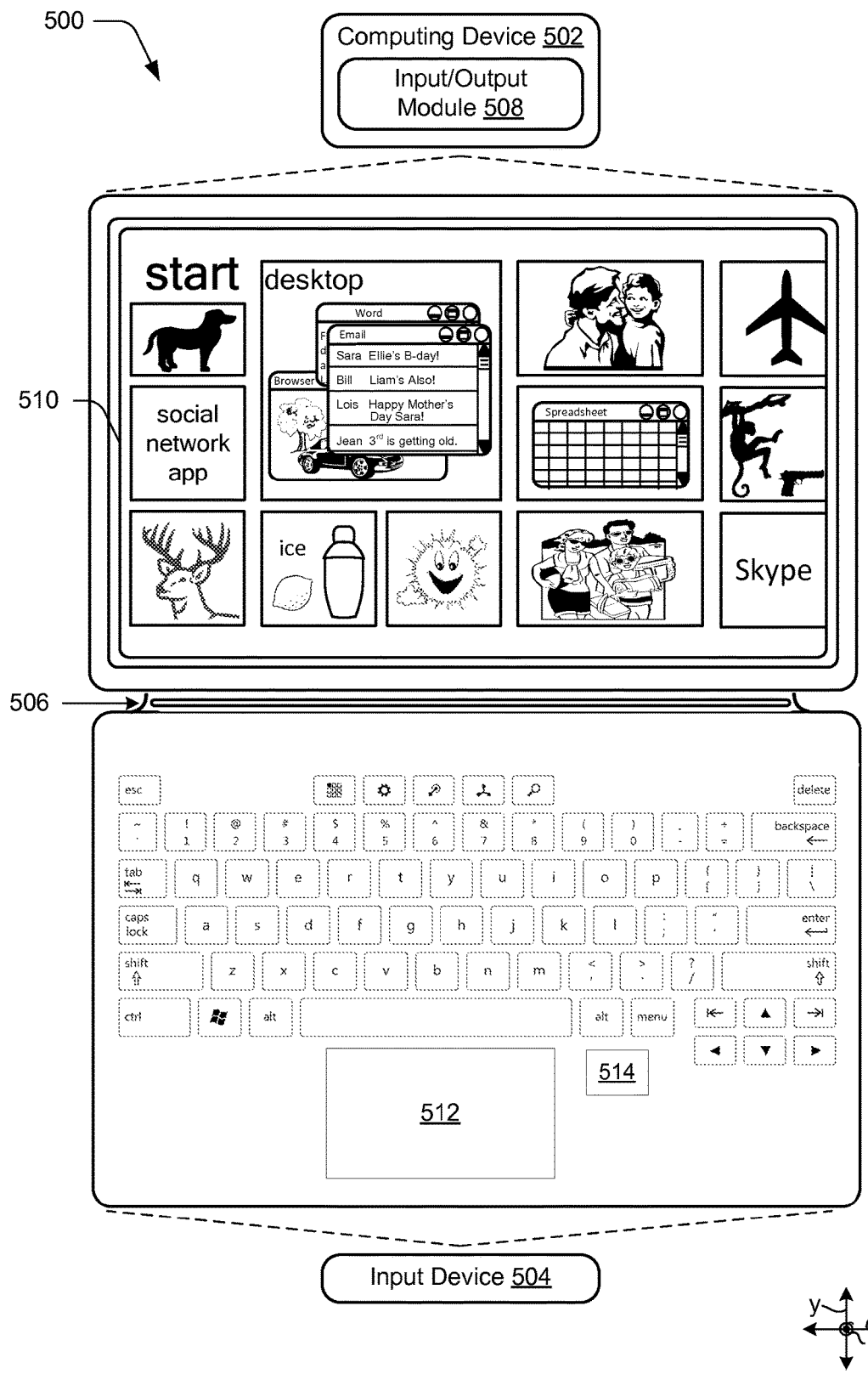
FIG. 5 is an illustration of an environment in an example implementation that is operable to employ the cosmetically hidden electrostatic discharge (ESD) protection structures described herein.

FIG. 5 depicts an example of a computing environment 500 that is operable to employ the cosmetically hidden ESD structure described herein. The illustrated environment 100 includes an example of a computing device 502 that is communicatively coupled to an input device 504 via a hinge 506. The computing device 502 may be configured to have a range of processing powers and memory capacities. The computing device 502 may also include software that causes the computing device 502 to perform one or more operations.

The computing device 502, for instance, is illustrated as including an input/output module 508. The input/output module 508 is representative of functionality relating to processing of inputs and rendering outputs of the computing device 502. A variety of different inputs may be processed by the input/output module 508, such as inputs relating to functions that correspond to keys of the input device 504, keys of a virtual keyboard displayed by the display device 510 to identify gestures and cause operations to be performed that correspond to the gestures that may be recognized through the input device 504 and/or touchscreen functionality of the display device 510, and so forth. Thus, the input/output module 508 may support a variety of different input techniques.

In the illustrated example, the input device 504 is configured as having an input portion that includes a keyboard having a QWERTY arrangement of keys and track pad although other arrangements of keys are also contemplated. Further, other non-conventional configurations are also contemplated, such as a game controller, configuration to mimic a musical instrument, and so forth. Thus, the input device 504 and keys incorporated by the input device 504 may assume a variety of different configurations to support a variety of different functionalities.

The input device further includes a trackpad 512 and a fingerprint sensor 514. The fingerprint sensor 514 includes an electrostatic discharge (ESD) protection structure surrounding at least a portion of the fingerprint sensor 514. In some examples, the surface of the trackpad 512 is at a same height (as measured in the z-direction) as the surface of the fingerprint sensor 514.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

Claim Support Section

In a first embodiment, an electronic device comprises an integrated circuit, an electrostatic discharge (ESD) protection structure positioned at least partially around a perimeter of the integrated circuit, the ESD protection structure configured to protect the integrated circuit from an electrostatic discharge strike; and a concealing layer positioned on a surface of the ESD protection structure, the concealing layer configured to at least partially conceal the ESD protection structure from view.

In a second embodiment, an electronic device comprises a substrate, an integrated circuit positioned on a surface of the substrate, defining a plane at the surface of the substrate, an electrostatic discharge (ESD) protection structure positioned at least partially around a perimeter of the integrated circuit, wherein the ESD protection structure is configured to protect the integrated circuit from an electrostatic discharge strike, and wherein the ESD protection structure extends from the substrate in a direction perpendicular to the plane of the surface of the substrate, and a concealing layer positioned on a surface of the ESD protection structure, wherein the concealing layer is configured to at least partially conceal the ESD protection structure from view, and wherein the concealing layer is positioned between the ESD protection structure and the integrated circuit.

In a third embodiment, an input device comprises a fingerprint sensor integrated circuit, an electrostatic discharge (ESD) protection structure positioned at least partially around a perimeter of the fingerprint sensor integrated circuit; the ESD protection structure configured to protect the fingerprint sensor integrated circuit from an electrostatic discharge strike, and a concealing layer positioned on a surface of the ESD protection structure, the concealing layer configured to at least partially conceal the ESD protection structure from view.

In a fourth embodiment, with reference to any of embodiments 1-3, the integrated circuit is a fingerprint sensor integrated circuit.

In a fifth embodiment, with reference to any of embodiments 1-4, the ESD protection structure comprises a metal plated trace.

In a sixth embodiment, with reference to the fifth embodiment, the metal plated trace is a gold plated trace.

In a seventh embodiment, with reference to any of embodiments 1-6, the ESD protection structure is a continuous structure positioned around the entire perimeter of the integrated circuit.

In an eighth embodiment, with reference to any of embodiments 1-6, the ESD protection structure comprises multiple segments positioned around less than the entire perimeter of the integrated circuit.

In a ninth embodiment, with reference to any of embodiments 1-8, the concealing layer comprises a conductive composition.

In a tenth embodiment, with reference to the ninth embodiment, the concealing layer is a paint layer.

In an eleventh embodiment, with reference to any of embodiments 1-10, the electronic device further comprises a surface layer positioned on a surface of the integrated circuit such that the surface layer is exposed to a user of the electronic device.

In a twelfth embodiment, with reference to the eleventh embodiment, the surface layer is a non-conductive layer or comprises a conductivity less than a conductivity of the concealing layer.

In a thirteenth embodiment, with reference to the eleventh embodiment or the twelfth embodiment, the surface layer is a paint layer or a glass layer.

In a fourteenth embodiment, with reference to any of embodiments 11-13, the surface layer and the concealing layer are a same color.

In a fifteenth embodiment, with reference to the first embodiment or any of embodiments 3-14, the integrated circuit and the ESD protection structure are individually positioned on a substrate layer, either directly on the substrate layer or through an intermediate soldering layer, such that the integrated circuit and the ESD protection structure are positioned on a same plane.

In a sixteenth embodiment, with reference to any of embodiments 1-15, the device further comprises a trackpad, wherein a surface of the trackpad is at a same height as a surface of the fingerprint sensor integrated circuit.

In a seventeenth embodiment, with reference to any of embodiments 1-16, the device further comprises a keyboard having a plurality of keys, wherein a surface of the plurality of keys of the keyboard is at a same height as a surface of the fingerprint sensor integrated circuit.

What is claimed is:

1. An electronic device comprising:
a fingerprint sensor integrated circuit configured to analyze a fingerprint of a user of the electronic device;
an electrostatic discharge (ESD) protection structure positioned at least partially around a perimeter of the fingerprint sensor integrated circuit, the ESD protection structure configured to protect the fingerprint sensor integrated circuit from an electrostatic discharge strike; and
a concealing layer positioned on a surface of the ESD protection structure, the concealing layer comprising a conductive paint composition configured to at least partially conceal the ESD protection structure from view.

2. The electronic device of claim 1, wherein the ESD protection structure comprises a metal plated trace.

3. The electronic device of claim 2, wherein the metal plated trace is a gold plated trace.

4. The electronic device of claim 1, wherein the ESD protection structure is a continuous structure positioned around the entire perimeter of the fingerprint sensor integrated circuit.

5. The electronic device of claim 1, wherein the ESD protection structure comprises multiple segments positioned around less than the entire perimeter of the fingerprint sensor integrated circuit.

6. The electronic device of claim 1, further comprising:
a surface layer positioned on a surface of the fingerprint sensor integrated circuit such that the surface layer is exposed to the user of the electronic device.

7. The electronic device of claim 6, wherein the surface layer is a non-conductive layer or comprises a conductivity less than a conductivity of the concealing layer.

8. The electronic device of claim 6, wherein the surface layer is a glass layer.

9. The electronic device of claim 6, wherein the surface layer is a paint layer, and
wherein the surface layer and the concealing layer are a same paint color.

10. The electronic device of claim 1, wherein the fingerprint sensor integrated circuit and the ESD protection structure are individually positioned on a substrate layer, either directly on the substrate layer or through an intermediate soldering layer, such that the fingerprint sensor integrated circuit and the ESD protection structure are positioned on a same plane.

11. An electronic device comprising:
a substrate;
an integrated circuit positioned on a surface of the substrate, defining a plane at the surface of the substrate;
an electrostatic discharge (ESD) protection structure positioned at least partially around a perimeter of the integrated circuit, wherein the ESD protection structure is configured to protect the integrated circuit from an electrostatic discharge strike, and wherein the ESD protection structure extends from the substrate in a direction perpendicular to the plane of the surface of the substrate; and
a concealing layer positioned on a surface of the ESD protection structure, wherein the surface of the concealing layer is positioned in a plane perpendicular to the surface of the substrate, wherein the concealing layer is configured to at least partially conceal the ESD protection structure from view, and wherein the concealing layer is positioned between the ESD protection structure and the integrated circuit.

12. The electronic device of claim 11, wherein the integrated circuit is a fingerprint sensor integrated circuit.

13. The electronic device of claim 11, wherein the ESD protection structure comprises a metal plated trace.

14. The electronic device of claim 11, wherein the concealing layer is a conductive paint layer.

15. An input device comprising:
- a fingerprint sensor integrated circuit configured to analyze a fingerprint of a user of the electronic device;
- an electrostatic discharge (ESD) protection structure positioned at least partially around a perimeter of the fingerprint sensor integrated circuit; the ESD protection structure configured to protect the fingerprint sensor integrated circuit from an electrostatic discharge strike;
- a concealing layer positioned on a surface of the ESD protection structure, the concealing layer comprising a conductive paint composition configured to at least partially conceal the ESD protection structure from view; and
- an external paint layer positioned on a surface of the fingerprint sensor integrated circuit such that the external paint layer is exposed to the user of the electronic device.

16. The input device of claim 15, further comprising:
- a trackpad, wherein a surface of the trackpad is at a same height as a surface of the fingerprint sensor integrated circuit.

17. The input device of claim 15, further comprising:
- a keyboard having a plurality of keys, wherein a surface of the plurality of keys of the keyboard is at a same height as a surface of the fingerprint sensor integrated circuit.

18. The input device of claim 15, wherein the conductive paint composition comprises graphite powder.

19. The electronic device of claim 1, wherein the conductive paint composition comprises a latex paint or an acrylic paint composition.

20. The electronic device of claim 19, wherein the conductive paint composition comprises graphite powder.

* * * * *